United States Patent [19]

Hamuro et al.

[11] Patent Number: 4,846,345
[45] Date of Patent: Jul. 11, 1989

[54] CASSETTE STORING A PLURALITY OF ELECTRONIC COMPONENT CHIPS INCLUDING MEANS FOR SECURING THE CASSETTE TO A HOPPER

[75] Inventors: Mitsuro Hamuro; Shinya Yamamoto; Koichi Saito, all of Kyoto, Japan

[73] Assignee: Murata Manufacturing Co., Ltd., Japan

[21] Appl. No.: 114,669

[22] Filed: Oct. 28, 1987

[30] Foreign Application Priority Data

Oct. 29, 1986 [JP] Japan ................... 61-257926

[51] Int. Cl.$^4$ .................. B65D 43/12; B65D 73/02
[52] U.S. Cl. ........................ 206/328; 29/740; 270/345; 221/174; 221/186; 221/785; 221/306
[58] Field of Search ............ 206/328, 329, 334; 220/345, 348, 351; 221/186, 154, 197, 174, 285, 303, 306; 29/739, 740, 741, 809; 414/126, 125

[56] References Cited

U.S. PATENT DOCUMENTS

| | | |
|---|---|---|
| 2,506,600 | 5/1950 | Kassovic .................. 206/818 X |
| 3,410,452 | 11/1968 | Igel et al. ....................... 221/197 |
| 3,441,165 | 4/1969 | Zampichelli ............. 206/380 X |
| 3,524,541 | 8/1970 | Nelson . | 
| 3,756,387 | 9/1973 | Chaney . |
| 4,359,157 | 11/1982 | Horstmann .................. 206/328 |
| 4,662,514 | 5/1987 | Berbeco ...................... 206/328 |

FOREIGN PATENT DOCUMENTS

| | | |
|---|---|---|
| 0168999A2 | 1/1986 | European Pat. Off. . |
| 0193255 | 9/1986 | European Pat. Off. .......... 29/741 |
| 3017687A1 | 11/1980 | Fed. Rep. of Germany . |
| 8130975U1 | 6/1981 | Fed. Rep. of Germany . |
| 1109480 | 1/1966 | United Kingdom . |
| 2089689 | 12/1981 | United Kingdom . |
| 2118144 | 4/1982 | United Kingdom . |

Primary Examiner—Stephen Marcus
Assistant Examiner—Bryon Gehman
Attorney, Agent, or Firm—Ostrolenk, Faber, Gerb & Soffen

[57] ABSTRACT

A plurality of electronic component chips (108) are stored in a space (109) defined in the interior of a case (111). The case is provided with an outlet (110) which communicates with the space for discharging the electronic component chips stored in the space. This outlet is closed by an openable closure. When the case is fixed to a hopper (102) included in an apparatus for supplying electronic component chips, the outlet is opened so that the electronic component chips are introduced into the hopper.

12 Claims, 9 Drawing Sheets

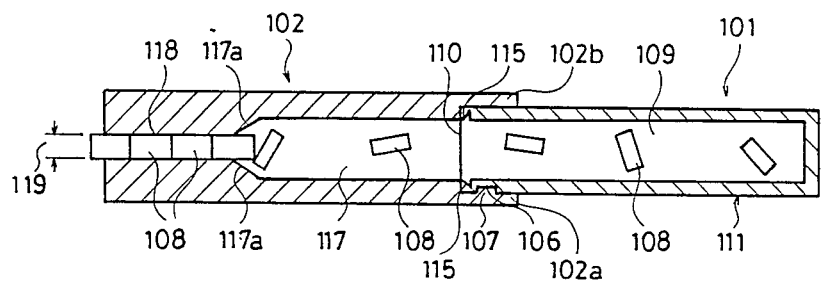
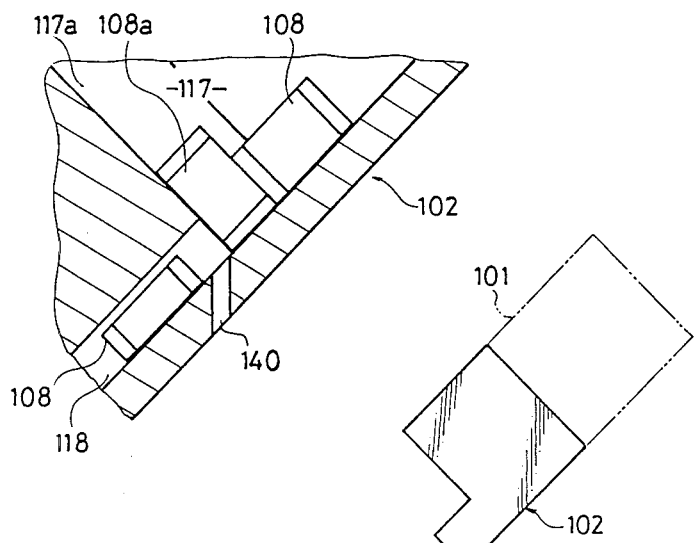
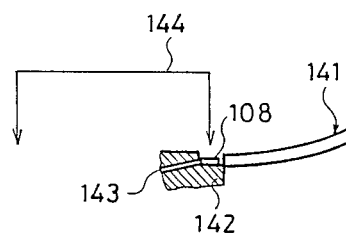

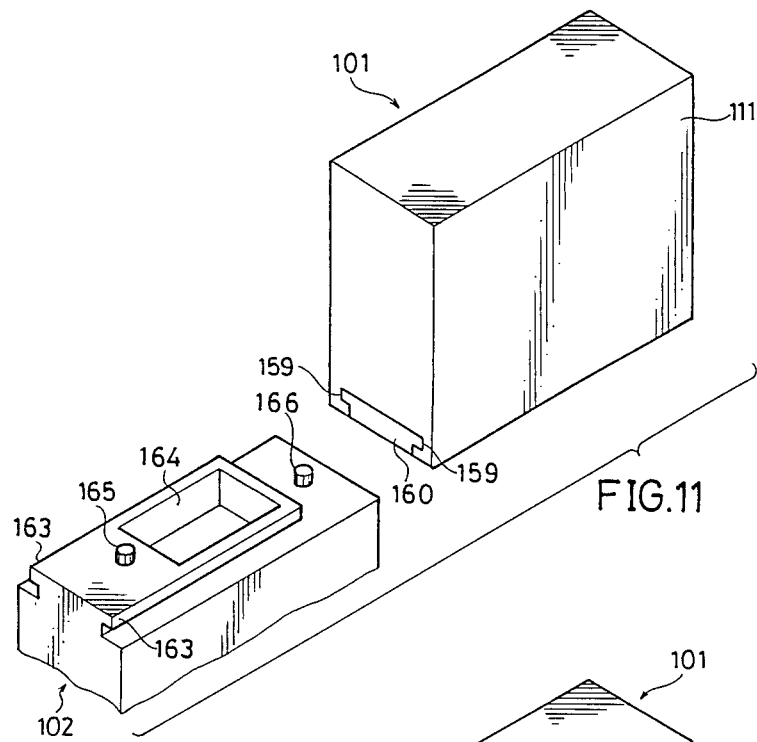
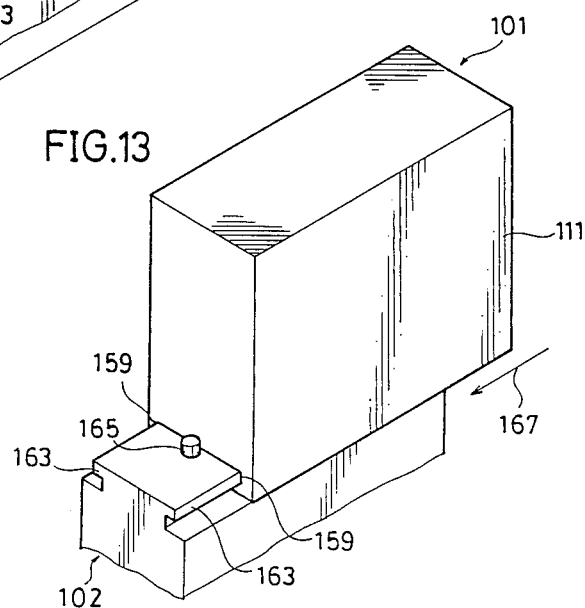

CASSETTE STORING A PLURALITY OF ELECTRONIC COMPONENT CHIPS INCLUDING MEANS FOR SECURING THE CASSETTE TO A HOPPER

BACKGROUND OF THE INVENTION

1. Field of the Invention

The present invention relates to a cassette storing a plurality of electronic component chips, which provides a form not only applicable to packaging and transportation of electronic component chips but also suitable for feeding a plurality of electronic component chips to an apparatus for supplying electronic component chips, such as a chip mounting apparatus for mounting the electronic component chips on printed circuit boards, etc.

The term "electronic component chip" herein used includes not only a "chip-like electronic component", being a finished product, but also a "chip-like electronic component body", being partially fabricated item, which is to be connected with lead wires or the like in a later step.

2. Description of the Prior Art

Electronic component chips have been generally packaged by a taping system, a magazine system, a bagging system and the like, and the taping system currently forms the mainstream because of its high reliability of automation in mounting. Packaging of electronic component chips by the taping system is disclosed in U.S. Pat. No. 4,298,120 entitled "Chip-like Electronic Component Series and Method for Supplying Chip-like Electronic Components" issued on Nov. 3, 1981 and granted to Kaneko, et al.

FIG. 14 shows exemplary packaging of electronic component chips by the taping system. This system comprises a tape member 2 rolled on a reel 1, for example, which tape member 2 is provided with a plurality of cavities distributed along its longitudinal direction to receive electronic component chips one by one in the cavities. In the taping system as shown in FIG. 14, the tape member 2 is in sandwich structure formed by a base tape 3 of cardboard, for example, and cover tapes 4 adhered to both surfaces thereof, as shown in section in a partially enlarged manner. The base tape 3 is provided with cavities 5, which are through-holes formed in the direction of thickness, to receive straight-sided electronic component chips 6, for example.

The aforementioned taping system can be directly applied to a chip mounting apparatus. Namely, one of the cover tapes 4 is stripped from the base tape 3 to open the cavities 5, thereby to discharge the electronic component chips 6. Such operation can be continuously performed while feeding the tape member 2 in the longitudinal direction.

In the magazine system, on the other hand, a plurality of electronic component chips, being in an aligned state, are received in a magazine. Such a magazine system is also directly applicable to a chip mounting apparatus.

In the bagging system, electronic component chips are simply packed in an appropriate bag, most inexpensively in the three types of packaging systems.

However, all of the aforementioned three types of packaging systems have problems to be solved.

In the taping system, submaterials other than the electronic component chips 6, such as the reel 1, the base tape 3 and cover tapes 4 as shown in FIG. 14, entail a high cost. Thus, the transportation cost per electronic component chip is increased due to the high cost relating to the submaterials. Further, the electronic component chips 6 are generally received one by one in the cavities 5, whereby a considerably long time is required to completely charge a prescribed number of electronic component chips 6. In addition, equipment for taping the electronic component chips 6 requires a relatively complicated mechanism, whereby the equipment cost is increased. In a chip mounting step on a consumer side, further, a plurality of reels 1 are generally transversely arranged to proces the tape members 2 drawn out from the reels 1 on the same plane, whereby an occupied floor space of chip mounting equipment is inevitably increased. Since the number of the electronic component chips 6 held in the tape member 2 rolled on a single reel 1 is limited, the reel 1 must be replaced by a new one when all of the electronic component chips 6 are discharged. The chip mounting apparatus must be temporarily stopped in this case. When the chip mounting apparatus is operated with a plurality of reels 1, the entire apparatus must be stopped even if the electronic component chips 6 are completely discharged merely in a single reel 1. Further, if the reels 1 carry different numbers of electronic component chips 6, the electronic component chips 6 are separately used up in the respective reels 1. Thus, the operation rate of the chip mounting apparatus is lowered by such factors.

On the other hand, in comparison with the taping system, the magazine system substantially requires no large occupied floor space in chip mounting equipment and the transportation cost thereof is relatively low, whereas the cost is increased by submaterials such as the magazine and a stopper for retaining the electronic component chips in the magazine as well as equipment for magazinization similarly to the taping system, while a long time is required for such magazinization. Further, the critical defect of the magazine system as compared with the other systems is that the number of electronic component chips receivable in a single magazine is small. Thus, remarkably caused in this system is the problem of lowering in the operation rate of the chip mounting apparatus, as hereinabove described with reference to the taping system.

In the bagging system, equipment required for packaging is at a low cost and the packaging time can be reduced. However, although submaterials required for simply bagging a prescribed number of electronic component chips are at a low cost, some means must be adopted in transportation, in order to prevent breakage of the electronic component chips etc. In general, bags each containing a plurality of electronic component chips are packed in a small box, and a plurality of such small boxes are packed in a box of medium size. Then, a plurality of such medium-sized boxes are finally packed in a large box for shipment. Thus, in view of packaging through such stages, the bagging system is not necessarily at a low cost. Further, a parts feeder must be employed in the chip mounting step, and a plurality of such parts feeders require a large floor space. In particular, storage vessels or hoppers in such parts feeders are generally circular in plane, and hence the same occupy a large floor space even if they are arranged in close contact with each other. In addition, the electronic component chips stored in the storage vessel may not be fully discharged depending on the form of the parts feeder.

There is an idea of making the storage vessel or hopper employed in the above parts feeder small-sized and straight-sided to enable arrangement of a plurality of such storage vessels or hoppers in closer contact with each other, thereby to reduce the occupied floor space. In this case, however, the number of electronic component chips stored in a single storage vessel or hopper must inevitably be reduced, and hence new electronic component chips must be frequently fed to the storage vessel or hopper. Further, in order to closely arrange a number of storage vessels or hoppers in a narrow floor space, openings of the storage vessels or hoppers must be made small narrowed as a matter of course, whereby it is difficult to supply prescribed electronic component chips to prescribed ones of the storage vessels or hoppers from the exterior. Different types of electronic component chips may be erroneously dropped in adjacent storage vessels or hoppers.

In recent years, electronic component chips are so extremely reduced in size that it may be difficult to apply the taping system or the magazine system to such miniature electronic component chips, setting aside the bagging system.

SUMMARY OF THE INVENTION

Accordingly, an object of the present invention is to provide a novel mode of packaging electronic component chips, which can solve the aforementioned problems of the conventional packaging systems.

In order to solve the aforementioned problems, the present invention provides a cassette storing electronic component chips, which is in the following structure:

The cassette storing electronic component chips according to the present invention is adapted to feed a plurality of electronic component chips to an apparatus for supplying electronic component chips. The said apparatus for supplying electronic component chips is a chip mounting apparatus, for example, or may be the aforementioned equipment for taping or magazinization.

Such a cassette storing electronic component chips comprises a plurality of electronic component chips, case means provided with an internal space storing the plurality of electronic component chips and an outlet communicating with the internal space for discharging the electronic component chips and openable closure means closing the outlet. The case has a fixing portion for fixing the case to the apparatus while directing the outlet to the apparatus.

The inventive cassette storing electronic component chips is suitable as a packaging form for shipment of electronic component chips by an electronic component manufacturer. A large number of electronic component chips can be efficiently simultaneously loaded in the internal space of the case, similarly to the bagging system. The electronic component chips can be stored in the space of the case in random conditions, and hence it is not necessary to direct the electronic component chips in a prescribed direction for the loading operation as in the taping and magazine systems or to load the same one by one, while no high-priced equipment is required for such operation. Further, since a number of electronic component chips can be stored in a single case, the packaging cost per chip is considerably reduced as compared with the taping and magazine systems. In addition, the inventive cassette storing electronic component chips is in such a constant form that at least the smallest box, being required for transportation in the conventional bagging system, is unnecessary, whereby a shippable form can be easily attained as compared with the bagging system. The transportation cost relating to submaterials other than the electronic component chips can be reduced according to the present invention as compared with the cost relating to submaterials required in the taping system or magazine system, as a matter of course.

Further, the cassette storing electronic component chips according to the present invention is particularly useful for storing miniature electronic component chips, handling of which is troublesome, since the electronic component chips may be randomly stored in the case.

On the other hand, the consumer of the electronic component chips stored in the inventive cassette can directly fix the cassette to a chip mounting apparatus to feed a plurality of electronic component chips to a chip mounting step. Namely, when the outlet of the case is directed to an opening of a hopper provided in the chip mounting apparatus, for example, to fix the case to the hopper through the fixing portion of the case and the closure means thereof is appropriately opened, the plurality of electronic component chips stored in the internal space of the case can be introduced into the hopper from the outlet. Handling of such a cassette is easy since its case has a constant form dissimilarly to the conventional bag. Even if the electronic component chips must be frequently supplied to the hopper, such operation can be efficiently performed by the excellent handling property of the cassette. Further, even if a plurality of hopers having relatively small openings are closely provided in a narrow space, no electronic component chips will be erroneously dropped in adjacent hoppers. The inventive cassette fixed to the hopper of a chip mounting apparatus can be easily replaced by a new one because of the aforementioned excellent handling property. Thus, a suitable number of electronic component chips are always stored in the hopper of the chip mounting apparatus, to enable continuous operation of the chip mounting apparatus.

As compared with the conventional parts feeder, all of the electronic component chips stored in the cassette can be discharged from the outlet, thereby to completely use up the electronic component chips.

Since the case of the inventive cassette can be equalized in size to the hoper, there is no need to widen intervals between hoppers in order to assemble such cassettes into the hoppers. Thus, even if the chip mounting apparatus has a number of hoppers provided in a narrow occupied space, the cassette according to the present invention can be applied without any problem.

While a constant type of electronic component chips stored in a single cassette must be aligned in a constant direction in advance to a final mounting stage, such alignment may essentially be performed by the chip mounting apparatus.

The case of the inventive cassette is also adapted to protect the electronic component chips stored in the internal space of the same against mechanical shocks and environment. Further, this case has a constant form dissimilarly to the bagging system. Thus, the cassette provides a form suitable for storing the electronic component chips both for manufacturers and consumers of electronic components.

The aforementioned effect in the chip mounting apparatus can also be attained when the inventive cassette is applied to a step other than the chip mounting step such as a taping step of the electronic component chips 6 as shown in FIG. 14.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view taken along the line IV—IV in FIG. 3;

FIG. 5 is an enlarged sectional view showing an example of preferable structure adopted for the hopper 102;

FIG. 6 is illustrative of exemplary structure of a part from the hopper 102 to a chip mounting station;

FIGS. 11 to 13 are illustrative of still another example of structure for fixing the cassette 101 to the hopper 102, as well as still another example of structure for opening a closure 160.

DESCRIPTION OF THE PREFERRED EMBODIMENTS

Figure 1:
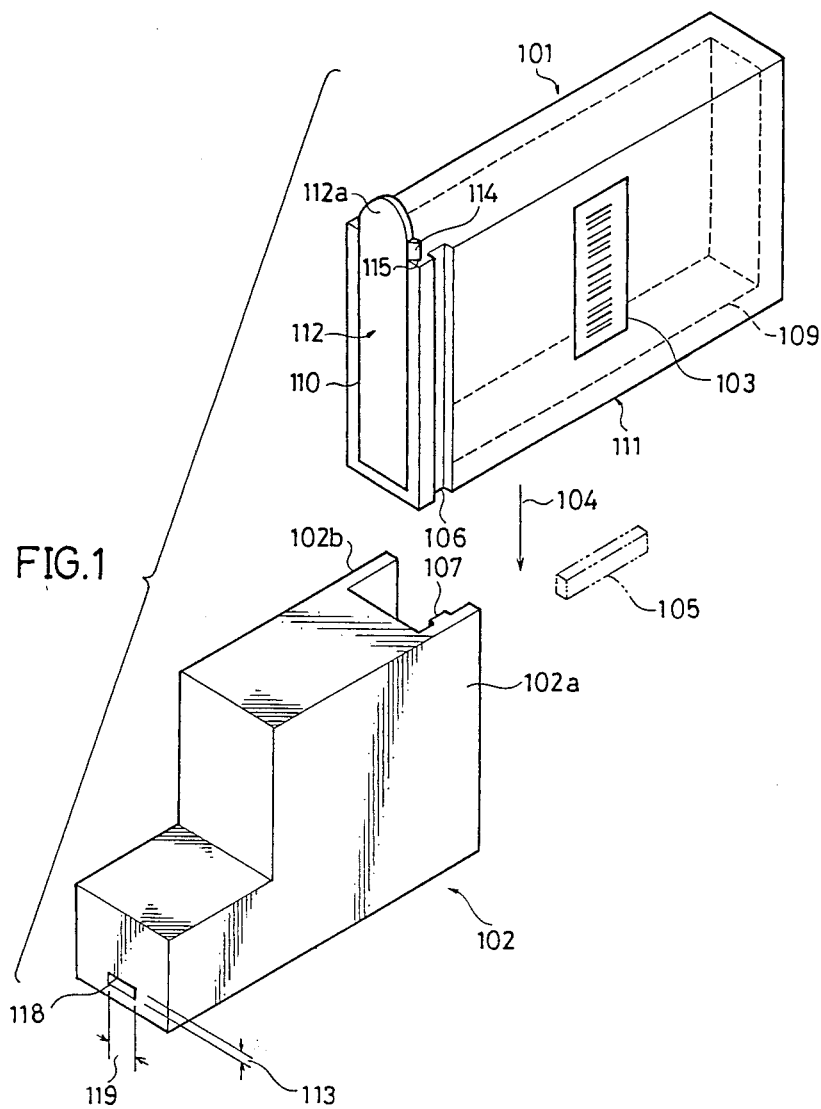
FIG. 1 is a perspective view showing appearance of a cassette 101 storing electronic component chips according to an embodiment of the present invention and a hopper 102.

FIG. 1 is a perspective view showing a cassette 101 storing electronic component chips according to an embodiment of the present invention and a hopper 102 of a chip mounting apparatus.

The cassette 101 has the shape of a rectangular parallelopiped, for example, and a label 103 is preferably attached on its side surface to provide readable indication means. The label 103 indicates information as to the type, quantity etc. of electronic component chips stored in the cassette 101 by optically or magnetically readable means such as bar codes. The cassette 101 is inserted, in a direction 104, in the hopper 102, which also serves as a base for holding the cassette 101. A reader 105 is preferably arranged in a position as shown by phantom lines, so as to read the information indicated on the label 103 by scanning the label 103 in the direction 104 of such fixing operation.

In order to facilitate the aforementioned insertion of the cassette 101 into the hopper 102 and position/fix the cassette 101 to the hopper 102, a pair of holding walls 102a and 102b are provided in the hopper 102 to receive an end portion of the cassette 101 between the holding walls 102a and 102b. Further, the cassette 101 is provided with a guide groove 106 and the holding wall 102a is provided in a corresponding position with a guide rib 107 which is slidably engaged with the guide groove 106. A guide mechanism corresponding to such combination of the guide groove 106 and the guide rib 107 may be further provided in relation to the holding wall 102b. Further, such guide groove and guide rib forming the guide mechanism may be reversed in positional relation.

Figure 2:
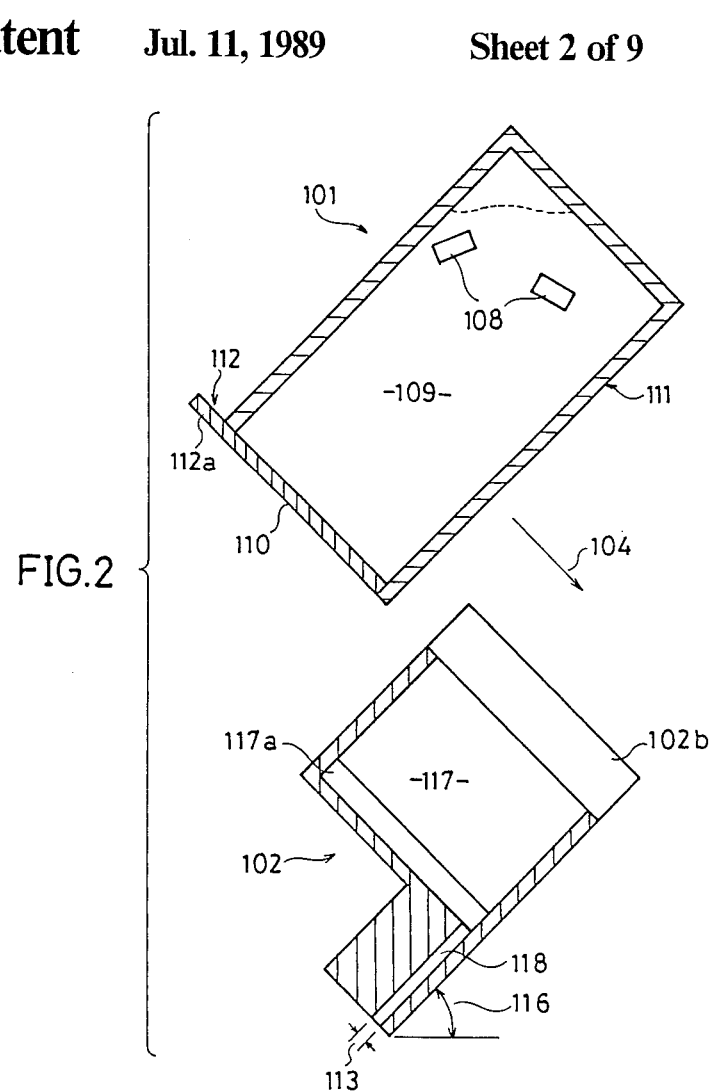
FIG. 2 is a longitudinal sectional view showing the cassette 101 and the hopper 102 of FIG. 1.

FIG. 2 is a longitudinal sectional view showing the cassette 101 and the hopper 102 in the relative positional relation as shown in FIG. 1.

Referring to FIGS. 1 and 2, the cassette 101 comprises a plurality of, e.g., straight-sided electronic component chips 108, a case 111 provided with an internal space 109 storing the electronic component chips 108 and an outlet 110 communicating with the internal space 109 for discharging the electronic component chips 108, and an openable closure 112 closing the outlet 110.

Although each of the electronic component chips 108 is generally provided with electrodes on both end portions thereof, display of such electrodes may be omitted as in the case of the electronic component chips 108 shown in FIG. 2 etc. Further, although the electronic component chips 108 as shown in FIG. 2 are straight-sided, the present invention is also applicable to cylindrical and disc-type electronic component chips and the like.

The case 111 is prepared by thermoplastic resin such as acrylic resin, acrylonitrile-butadien-styrene resin, styrene resin, polycarbonate, etc. In order to prevent static electricity caused by friction between the electronic component chips 108 themselves or between the electronic component chips 108 and the case 111, antistatic processing is preferably performed on the case 111. In addition to the aforementioned resin, the case 111 may be prepared by metal, paper or composite thereof (e.g., laminated substance).

The closure 112 can be removed by being pulled upwardly, for example, thereby to open the outlet 110. The closure 112 is provided on both sides thereof with guide ribs 114, for example, and the case 102 has a guide groove 115 for receiving the guide ribs 114. Thus, the closure 112 is positioned with respect to the case 111 and the operation for extracting the closure 112 is guided.

In shipment of the cassette 101, loaded with the plurality of electronic component chips 108, a vacuum package (not shown) is preferably applied to cover the cassette 101 in the form as shown in FIGS. 1 and 2.

As shown in FIG. 2, the hopper 102 is mounted on the chip mounting apparatus in an inclined state, for example. An angle 116 of inclination is selected at about 45°, for example.

Figure 3:
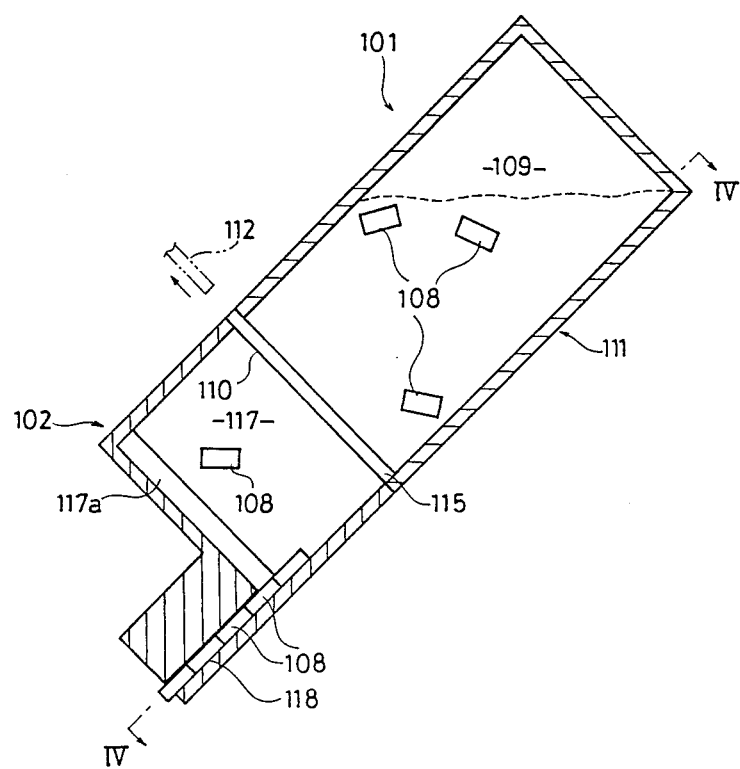
FIG. 3 is a longitudinal sectional view showing a state in which the cassette 101 as shown in FIG. 2 is fixed to the hopper 102.

FIG. 3 is a longitudinal sectional view showing a state in which the cassette 101 is fixed to the hopper 102, and FIG. 4 is a sectional view taken along the line IV—IV in FIG. 3.

As hereinabove described, the cassette 101 is held between the pair of holding walls 102a and 102b and guided by the guide groove 106 and the guide rib 107 to be fixed to the hopper 102 as shown in FIGS. 3 and 4, and thereafter the closure 112 is extracted. In order to enable extraction of the closure 112 after such fixation of the cassette 101 to the hoper 102, an end 112a of the closure 112 extends beyond the upper end surface of the case 111 (FIGS. 1 and 2). When the closure 112 is extracted, the electronic component chips 108 are discharged from the outlet 110 through gravity due to presence of the aforementioned angle 116 of inclination. A snap-like engaging mechanism (not shown) utilizing spring means or the like may be employed in order to more securely retain the fixed state of the cassette 101 with respect to the hopper 102.

The hopper 102 is provided with a storage space 117 having an opening for communicating with the space 109 of the cassette 101 through the outlet 110, thereby to temporarily store the electronic component chips 108 discharged from the cassette 101. An aligning passage 118 is provided to communicate with the lower end portion of the storage space 117. The aligning passage 118 is adapted to align the electronic component chips 108 while turning the same to a prescribed direction, as shown in FIGS. 3 and 4. As shown in FIGS. 1 and 2, vertical size of the aligning passage 118 is selected to accept only the minimum size of the straight-sided electronic component chips 108 within vertical, transverse and perpendicular ones thereof which are orthogonal to each other. In general, the vertical size 113 is selected to be larger by about 0.2 to 0.3 mm than the aforementioned minimum size of the electronic component chips 108. As shown in FIGS. 1 and 4, transverse size 119 of the aligning passage 118 is selected to accept the intermediate size of the electronic component chips 108 but reject the maximum size. In general, the transverse size 119 is selected to be larger by about 0.2 to 0.3 mm than the intermediate size of the electronic component chips 108.

An inclined surface 117a is provided between the storage space 117 and the aligning passage 118 so that the electronic component chips 108 stored in the storage space 117 of the hopper 102 can be easily turned to a prescribed direction to be introduced into the aligning passage 118.

Although the aligning passage 118 is transversely longitudinal in section in the aforementioned embodiment, the same may be vertically longitudinal in section.

FIG. 5 shows exemplary structure for aligning the electronic component chips preferably adopted for the hopper 102, although such structure is not directly related to the subject matter of the present invention. As shown in FIG. 5, an electronic component chip 108a being close to the boundary between the storage space 117 and the aligning passage 118 tends to block an inlet of the aligning passage 118. In order to prevent this, a blowing passage 140 is preferably provided for blowing compressed air against the electronic component chip 108a. The blowing passage 140 is intermittently supplied with compressed air thereby to blow off an electronic component chip such as the electronic component chip 108a blocking the aligning passage 118, so that the electronic component chips 108 are smoothly transferred through the aligning passage 118.

FIG. 6 shows exemplary structure of a part from the hopper 102 to a chip mounting station in the chip mounting apparatus.

A tube 141 for carrying the electronic component chips 108 is coupled to communicate with the aligning passage 118 (FIG. 1) provided in the hopper 102. The tube 141 forms a passage having a section analogous to a section defined by the minimum size and the intermediate size of the electronic component chips 108. An electronic component chip 108 to be discharged from the tube 141 has its minimum size being vertically directed.

A positioning stand 142 is provided adjacent to an outlet of the tube 141. The positioning stand 142 is provided with a vacuum passage 143 which is supplied with vacuum at prescribed time intervals to draw the electronic component chips 108 being discharged from the tube 141, thereby to position the same on the positioning stand 142. The electronic component chips 108 thus positioned on the positioning stand 142 are carried by a vacuum suction chuck (not shown) or the like in a direction 144, to be supplied onto appropriate circuit substrates (not shown).

It is to be noted that the electronic component chips 108 as shown in FIGS. 2 to 4 are exaggerated in size as compared with the case 111. In practice, a single case 111 can store 5000 or more electronic component chips 108, for example, in its space 109.

Although FIG. 2 shows the storage space 117 of the hopper 102 in an empty state, the cassette 101 is mainly adapted to facilitate continuous operation of the chip mounting apparatus and hence the same is replaced by a new one before the electronic component chips 108 stored in the storage space 117 of the hopper 102 are completely discharged. The case 111 and the hopper 102 may be at least partially transparent so that the residual state of the electronic component chips 108 can be observed from the exterior.

Although the closure 112 is completely extracted to entirely open the outlet 110 as shown in FIG. 3, the electronic component chips 108 may be fed to the hopper 102 while partially retaining the closure 112 in the case 111.

Figure 7:
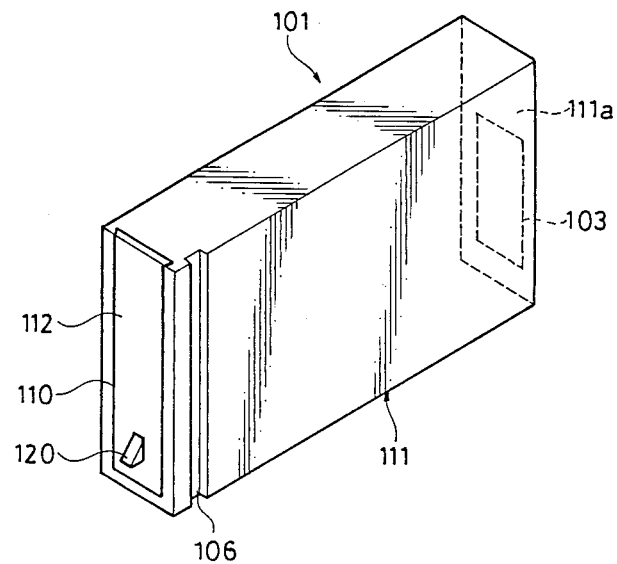
FIG. 7 is a perspective view showing appearance of a cassette 101 storing electronic component chips according to another embodiment of the present invention.

FIG. 7 is a perspective view showing appearance of a cassette 101 storing electronic component chips according to another embodiment of the present invention. The cassette 101 includes a number of elements common to those of the cassette 101 as shown in FIG. 1 etc., and hence the common elements are indicated by similar reference numerals to avoid redundant description.

The feature of the cassette 101 as shown in FIG. 7 resides in a closure 112. The closure 112 is provided with a projecting engaging member 120. This engaging member 120 is engaged with a part of a hopper 102 when the cassette 101 is fixed to the hopper 102 in the state as shown in FIG. 3 from the state of FIG. 2, to enable automatic opening of the closure 112. Therefore, the upper end portion of the closure 112 may not extend beyond the upper end surface of a case 111.

In the cassette 101 as shown in FIG. 7, further, a label 103 is attached on a side surface 111a of the case 111 opposite to the closure 112. The label 103 is adhered in such a position that an element corresponding to the reader 105 as shown in FIG. 1 can be provided in an enough space even if a number of hoppers 102 as shown in FIG. 1 are closely provided in the transverse direction.

The above description has been made with no reference to a manner of introducing the plurality of electronic component chips 108 into the space 109 of the case 111, while the outlet 110 may be simply used as an inlet before the same is closed by the closure 112. However, such an inlet may be individually provided in another surface of the case 111. Such an inlet is preferably closed by a movable cover.

Description is now made on another example of means for fixing the cassette 101 to the hopper 102, which means has been illustrated by the pair of holding walls 102a and 102 and the guide groove 106 as well as the guide rib 107 etc. in the embodiment as shown in FIGS. 1 to 4. Reference numerals used in the embodiment as described with reference to FIGS. 1 to 4 are commonly employed in the following description.

Figure 8:
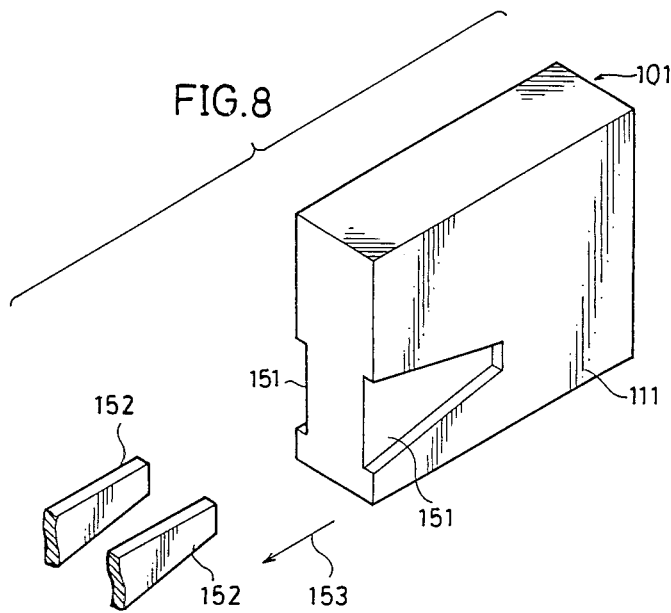
FIGS. 8 and 9 are illustrative of another mode of fixing the cassette 101 to the hopper 102.
Figure 9:
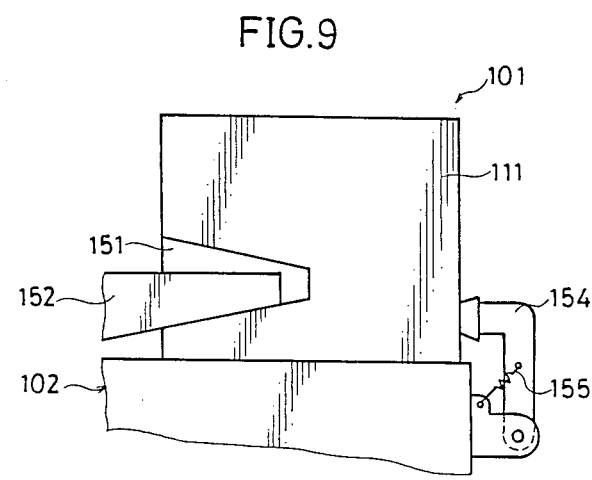

In the example as shown in FIGS. 8 and 9, tapered trapezoidal engaging recesses 151 are formed on both side surfaces of a case 111 of a cassette 101, and a pair of positioning guides 152 are fixedly provided in a chip mounting apparatus. When the cassette 101 is slid in a direction 153 as shown in FIG. 8 on the upper surface of a hopper 102 as shown in FIG. 9, the pair of positioning guides 152 are engaged into the engaging recesses 151 respectively, so that an outlet (not shown) of the cassette 101 is downwardly provided in FIG. 9 and an opening (not shown) of the hopper 102 is provided on its upper surface so that the outlet and the opening are aligned with each other in the state as shown in FIG. 9.

As shown in FIG. 9, a pressing member 154 may be provided in relation to the hopper 102, in order to facilitate positioning of the cassette 101. The pressing member 154 is urged by a spring 155, for example, to press the cassette 101 against the positioning guides 152.

Figure 10:
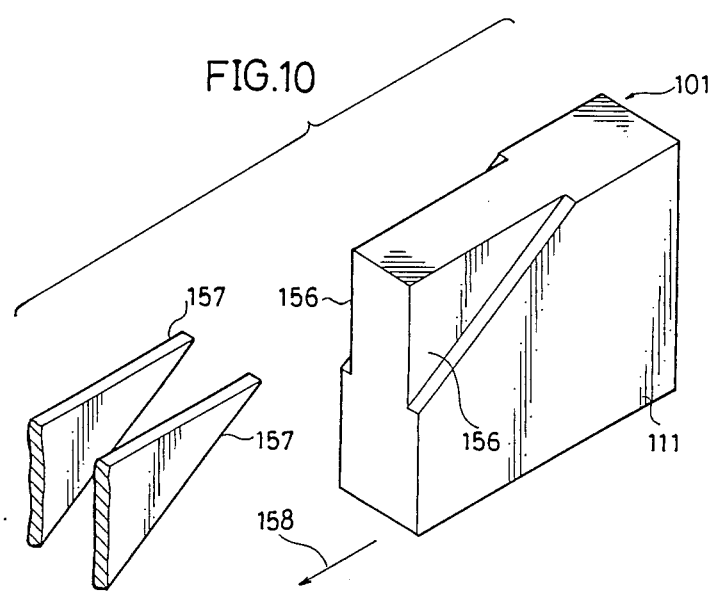
FIG. 10 is a perspective view showing a modification of the fixing mode as shown in FIGS. 8 and 9.

An example as shown in FIG. 10 is similar to the example as shown in FIGS. 8 and 9. In this example, triangular engaging recesses 156 are provided on both side surfaces of a case 111 of a cassette 101. On the other hand, a chip mounting apparatus is provided with a pair of positioning guides 157, configurations of which are conformed to the engaging recesses 156 respectively. When the cassette 101 is moved in a direction 158, the positioning guides 157 are engaged into the engaging recesses 156 respectively, whereby the cassette 101 is positioned similarly to the case of FIG. 9.

In each of the examples as shown in FIGS. 8 and 9, and FIG. 10, the engaging recesses 151 or 156 may be replaced by ribs of similar configurations extending from both side surfaces of the case 111.

Figure 12:
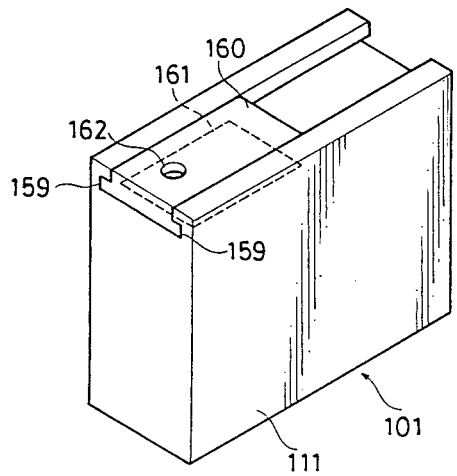
Figure 14:
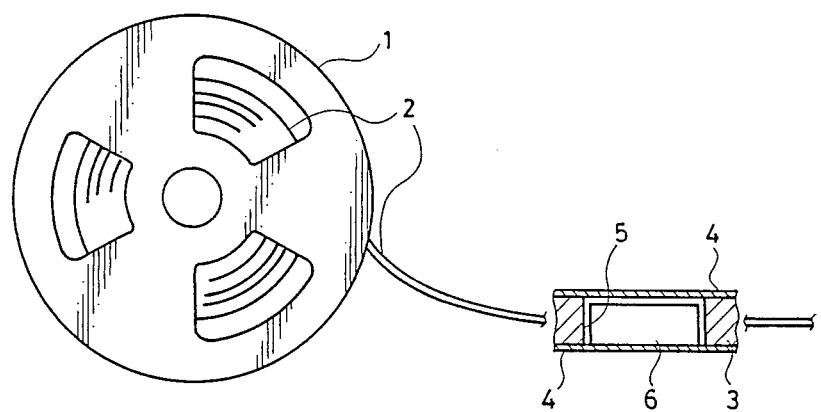
FIG. 14 illustrates a taping system as an exemplary conventional form of packaging electronic component chips.

FIGS. 11 to 13 are illustrative of still another example, in which a sliding mechanism is employed to fix a cassette 101 to a hopper 102.

As obvious from FIG. 12 which shows the cassette 101 of FIG. 11 in a vertically inverted manner, an opposite pair of grooves 159 are provided on the lower surface of a case 111. The grooves 159 are engaged with a closure 160, being T-shaped in section, to slidably retain the same. As shown by dotted lines in FIG. 12, an outlet 161 is formed in a substantially half region of the lower surface of the case 111. The closure 160 is provided with a cavity 162.

As shown in FIG. 11, on the other hand, the hopper 102 is provided on its upper surface with a pair of slide rails 163, which are similar in section to the closure 160. An opening 164 is defined in a region between the pair of slide rails 163, and a projecting stopper 165 is provided in proximity to the opening 164. An engaging projection 166 is provided on the upper surface of the hopper 102 beyond an end of each slide rail 163.

In order to fix the cassette 101 to the hopper 102 as shown in FIG. 13, the engaging projection 166 is engaged with the cavity 162 provided in the closure 160. Then the cassette 101 is slid in a direction 167 as shown in FIG. 13, so that the pair of slide rails 163 are engaged with the pair of grooves 159 respectively, and finally the projecting stopper 165 is brought into contact with an end surface of the cassette 101 thereby to position the cassette 101. Since the closure 160 is held in the hopper 102 side by engagement of the cavity 162 and the engaging projection 166, the closure 160 is opened in response to the sliding movement of the cassette 101. After the closure 160 is thus opened, the outlet 161 of the cassette 101 is aligned with the opening 164 of the hopper 102.

Although the engagement of the cavity 162 and the engaging projection 166 is adapted to facilitate alignment of the cassette 101 and the hopper 102 in advance to fixation of the former to the latter and to properly position the slide rails 163 in the grooves 159 in an initial stage of sliding movement of the cassette 101 in the direction 167, the cavity 162 and the engaging projection 166 may be omitted from the structure. Also in this case, the end surface of the closure 160 is brought into contact with a terminating end surface of a portion provided with the pair of slide rails 163, so that the closure 160 can be opened in response to sliding movement of the cassette 101 in the direction 167.

While various means for fixing the cassettes 101 to the hoppers 102 have been disclosed in the aforementioned embodiments, such fixing means may employ magnetic attraction, for example. When a magnetically attractable metal plate or foil is attached to the case 111 of the cassette 101 and a magnet is fixed to the hopper 102, for example, the cassette 101 can be fixed to the hopper 102 by magnetic attraction.

Further, specific structure for providing such fixing means may not be provided in the cassette 101 but simply in the hopper 102. Thus, the case 111 of the cassette 101 may be provided with a mere fixing portion, which is fixed by the fixing means provided in the hopper 102.

In addition, if a lower part of a case is provided in a V-shaped or trapezoidal projecting configuration while such a lower part is used as a fixing portion and a hopper is conformed to the same, the cassette can be naturally positioned and fixed to the hopper by its own weight by simply placing the cassette on the hopper.

Although the present invention has been described and illustrated in detail, it is clearly understood that the same is by way of illustration and example only and is not to be taken by way of limitation, the scope of the present invention being limited only by the terms of the appended claims.

What is claimed is:

1. A cassette for storing a plurality of electronic component chips for feeding said plurality of electronic component chips to an apparatus effective for supplying electronic component chips, said cassette comprising:
case means provided with an internal space for storing said plurality of electronic component chips and an outlet communicating with said internal space for discharging said electronic component chips therethrough;
openable closure means closing said outlet;
means for slidably guiding said closure means with respect to said case means along a sliding direction thereby to open said closure means, said guiding means including a projecting portion extending along said sliding direction for being received in a receiving groove on said apparatus; and
said case means having a fixing portion for fixing said case to said apparatus, said fixing portion located adjacent said outlet.

2. A cassette in accordance with claim 1, wherein said closure means has means for enabling opening of the same after said case means is fixed to said apparatus.

3. A cassette in accordance with claim 2, wherein said case means has means for linearly slidably guiding said closure means thereby to open the same, and said means for enabling opening of said closure means includes means for outwardly exposing an end of said closure means in a state that said case is fixed to said apparatus.

4. A cassette in accordance with claim 1, further including readable indication means provided on the outer surface of said case means for indicating information including the type and quantity of said electronic component chips stored in said space, said indication means being read by scanning the same in a direction of operation for fixing said case means to said apparatus.

5. A cassette in accordance with claim 1, wherein said case means has first guide means for linearly slidably guiding said closure means thereby to open the same, said fixing portion has second guide means for slidably guiding said case means in a direction of said sliding movement of said closure means, and said means for enabling opening of said closure means has means being engaged with said apparatus during said sliding operation of said case means by said second guide means.

6. A cassette in accordance with claim 1, wherein said case means is at least partially formed of transparent material.

7. A cassette in accordance with claim 1, wherein said closure means includes grasping means for enabling grasping of the closure means to allow moving of said closure means along said sliding direction.

8. A cassette for storing a plurality of electronic component chips for feeding said plurality of electronic component chips to an apparatus effective for supplying electronic component chips, said cassette comprising:

case means provided with an internal space for storing said plurality of electronic component chips and an outlet communicating with said internal space for discharging said electronic component chips therethrough;

openable closure means for closing said outlet; and said case means having a fixing portion for fixing said case to said apparatus, said fixing portion located adjacent said outlet, said fixing portion including a part of a wall surface of said case means which defines a groove.

9. A cassette in accordance with claim 8, wherein said closure means has means for enabling opening of the same after said case means is fixed to said apparatus.

10. A cassette in accordance with claim 8, further including readable indication means provided on the outer surface of said case means for indicating information including the type and quantity of said electronic component chips stored in said space, said indication means being read by scanning the same in a direction of operation for fixing said case means to said apparatus.

11. A cassette in accordance with claim 8, wherein said case means is at least partially formed of transparent material.

12. A cassette for storing a plurality of electronic component chips for feeding said plurality of electronic component chips to an apparatus effective for supplying electronic component chips, said cassette comprising:

case means provided with an internal space for storing said plurality of electronic component chips and an outlet communicating with said internal space for discharging said electronic component chips therethrough;

openable closure means closing said outlet; and said case means having a fixing portion for fixing said case to said apparatus, said fixing portion located adjacent said outlet, wherein said fixing portion includes a part of the wall of said casing means which projects outwardly for defining a tab which is receivable within a corresponding groove of the apparatus.

* * * * *